US006514840B2

(12) United States Patent
Barrett et al.

(10) Patent No.: US 6,514,840 B2
(45) Date of Patent: *Feb. 4, 2003

(54) MICRO HEATING OF SELECTIVE REGIONS

(75) Inventors: Howard Ted Barrett, Starksboro, VT (US); Toshiharu Furukawa, Essex Junction, VT (US); Donald W. Rakowski, Milton, VT (US); James Albert Slinkman, Montpelier, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,932

(22) Filed: Apr. 13, 1999

(65) Prior Publication Data

US 2001/0044175 A1 Nov. 22, 2001

(51) Int. Cl.$^7$ ............................................. H01L 21/324
(52) U.S. Cl. ........................................ 438/530; 438/798
(58) Field of Search ................................. 438/510, 514, 438/517, 535, 531, 944, 945, 795, 798

(56) References Cited

U.S. PATENT DOCUMENTS

| 4,144,101 | A | * | 3/1979 | Rideout ....................... 438/531 |
| 4,337,115 | A | * | 6/1982 | Ikeda et al. ................. 438/944 |
| 4,441,931 | A | * | 4/1984 | Levin ........................... 438/944 |
| 4,621,411 | A | | 11/1986 | Havemann et al. |
| 5,474,940 | A | | 12/1995 | Tsukamoto |
| 5,541,119 | A | * | 7/1996 | Kodama ..................... 438/945 |
| 5,569,624 | A | | 10/1996 | Weiner |
| H1637 | H | * | 3/1997 | Offord et al. |
| 5,688,715 | A | | 11/1997 | Sexton et al. |

FOREIGN PATENT DOCUMENTS

JP          03203334 A  *  9/1991  ................. 438/297

* cited by examiner

*Primary Examiner*—Savitri Mulpuri
(74) *Attorney, Agent, or Firm*—Schmeiser, Olsen & Watts; William D. Sabo

(57) ABSTRACT

A method for selectively heating a substrate without damaging surrounding regions of the substrate. In particular, the invention provides for a method of selectively activating doped regions of a semiconductor device without damaging surrounding doped and activated regions. Specifically, the invention provides a laser anneal which activates locally doped regions, while surrounding doped and activated regions are protected using a reflective mask.

2 Claims, 4 Drawing Sheets

MICRO HEATING OF SELECTIVE REGIONS

BACKGROUND OF THE INVENTION

1. Technical Field

The present invention relates generally to semiconductor manufacturing, and more particularly, to a method of selectively heating particular regions of a substrate without damaging surrounding regions.

2. Related Art

In the manufacture of semiconductor devices, a semiconductor substrate is often subjected to an ion implanting process to form heavily doped source-drain regions of CMOSFET devices. Subsequent to the ion implanting process, the substrate is exposed to high temperatures. This type of annealing process is necessary to restore the crystallinity of the substrate and electrically activate the doped ions implanted in the surface of the substrate. This is typically accomplished via a furnace, rapid thermal, or laser annealing process.

However, since the annealing process currently used heats the entire substrate, it is difficult to achieve optimal results for multiple dopant anneals since the heat cannot be focused exclusively on a desired area. In fact, when the substrate is exposed to high temperatures the profiles of surrounding doped shallow source-drain regions may become deformed, move or increase in depth in the substrate thereby degrading the device performance characteristics. Consequently, it is very difficult to form the shallow junctions necessary for high performance semiconductor devices using a conventional wafer annealing method.

Based on the above description, there is a need for a new method of selectively heating particular regions of a substrate without damaging surrounding regions. More particularly, there is a need for a method of forming and activating locally doped regions of a semiconductor substrate that will not damage the surrounding doped and activated regions.

SUMMARY OF THE INVENTION

The present invention provides a method of overcoming the above-identified problems of the related art by selectively activating certain doped regions of a semiconductor substrate using a laser, while protecting the surrounding doped and activated regions using a photolithographically defined reflective mask.

The first general aspect of the present invention provides a method for local activation comprising the steps of: providing a substrate having a first section and a second section, wherein the first section contains at least one doped and activated region; depositing a reflective mask over the first section to protect the at least one doped and activated region; implanting a dopant species in at least one region of the second section; and activating the dopant species. This aspect provides for a method of activating doped regions of a semiconductor device. Further, this aspect provides for the use of a reflective mask to prevent the destruction of underlaying doped and activated regions when the substrate is exposed to the activation process.

The second general aspect of the present invention provides a method for local activation of a semiconductor device including the steps of: depositing a reflective mask over a previously doped and activated first section of a substrate; implanting a dopant on a second section of the substrate; and activating the dopant of the second section. This aspect provides similar advantages as those described in the first aspect.

The third general aspect of the present invention provides for a reflective mask used to protect underlaying regions of a semiconductor substrate upon dopant activation of adjacent portions of the substrate. This aspect provides similar advantages as the first aspect.

The fourth general aspect of the present invention provides for a semiconductor device comprising: a substrate having a previously doped and activated first section, and a second section; a reflective mask over the first section to protect the first section from damage caused by further processing; and at least one inactivated doped region in the second section. This aspect provide for a device formed in accordance with the present invention.

The fifth general aspect of the present invention provides for a semi-transparent layer of reflective material, having a topography with varying thickness, to allow for the selective activation of a doped region. This aspect allows for the selective activation of particular regions to varying degrees.

The foregoing and other features and advantages of the invention will be apparent from the following more particular description of the preferred embodiments of the invention.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiments.

Figure 1:
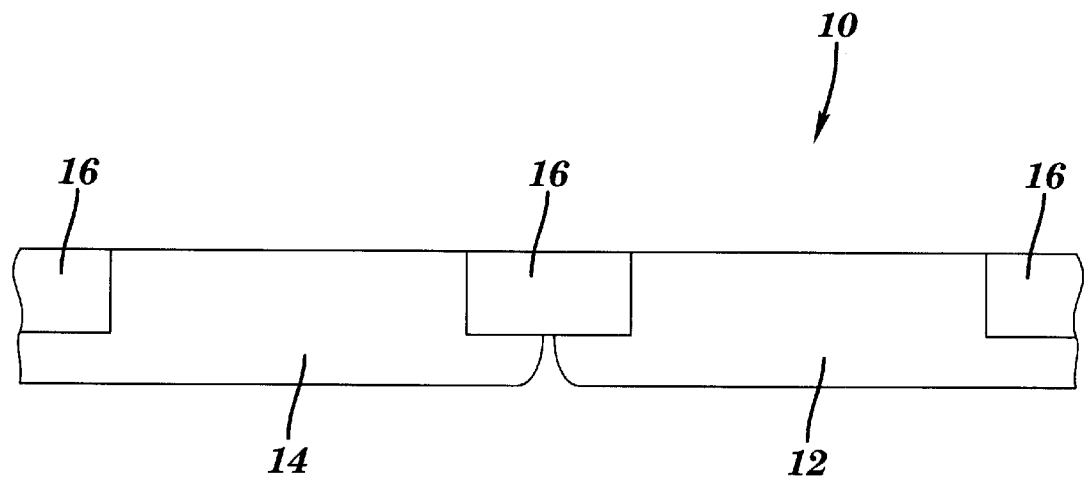
FIG. 1 depicts a semiconductor substrate in accordance with the present invention.

Referring to FIG. 1, a semiconductor substrate 10, typically made of silicon, including N-well 12, P-well 14, and shallow trench isolations (hereafter "STI") 16, is depicted in accordance with the present invention. STI 16 are formed within substrate 10 at a depth of about 0.25 microns, by an etching process or other comparable process. STI 16 are filled with silicon dioxide via a chemical vapor deposition (CVD) technique and the surface is planarized by chemicalmechanical polishing or other known methods. N-well 12 and P-well 14, separated by STI 16, are formed within substrate 10 and activated using conventional annealing processes.

Figure 2:
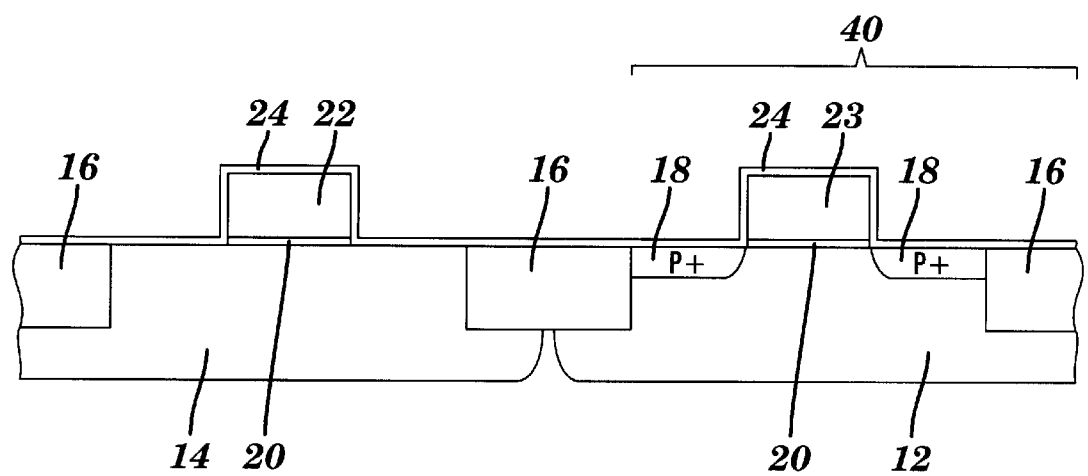
FIG. 2 depicts the formation of a PMOSFET in accordance with the present invention.

As depicted in FIG. 2, a gate oxide layer 20, having a thickness of about 3 to 10 nm (30 to 100 angstrom), is formed on the surface of substrate 10 using thermal growth techniques commonly used in the industry. A layer of polysilicon is deposited onto gate oxide layer 20 using chemical-vapor deposition (CVD). The layer of polysilicon is patterned to form polysilicon gates 22 and 23 via reactive-ion etching, or other suitable processes. Gate oxide layer 20 is also etched during this process, thereby limiting gate oxide layer 20 to the area directly under polysilicon gates 22 and 23. A layer of silicon dioxide 24, or other insulating material, is deposited over the entire surface of substrate 10 at a thickness of about 5 to 10 nm (50 to 100 angstrom), using CVD. N-well 12 and polysilicon gate 23 are doped with p+ ions then annealed using conventional methods. Heavily doped P-type source and drain regions 18 and doped polysilicon gate 23 form PMOSFET 40, which the present invention is designed to protect from damage that typically results from the subsequent doping and activation processes performed on P-well 14.

Figure 3:
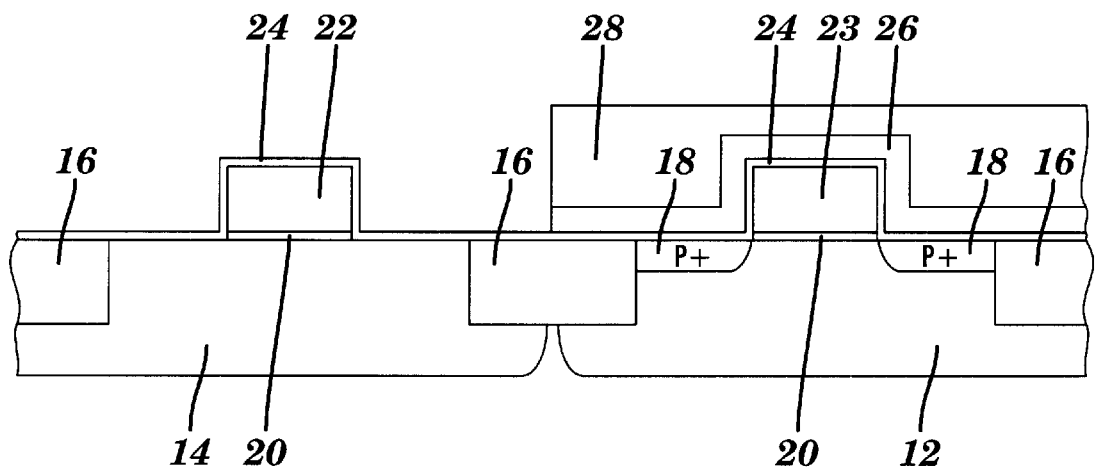
FIG. 3 depicts the deposition of a reflective mask and photoresist mask on the semiconductor substrate in accordance with the present invention.

As depicted in FIG. 3, a reflective mask 26 comprising a semi-transparent reflective material, such as aluminum, tungsten, copper, gold, etc., having a thickness of about 50 to 500 nm (500 to 5000 angstrom), is deposited over the entire silicon dioxide layer 24. A photoresist mask 28 is deposited on reflective mask 26, using conventional methods, to photopattern and remove the portion of reflective mask 26 over P-well 14, thereby exposing that section of substrate 10 for subsequent doping. Photoresist mask 28 is removed using a conventional process, leaving reflective mask 26 over PMOSFET 40 of N-well 12. The reflective mask 26 is used to protect doped source and drain regions 18 and doped polysilicon gate 23 of PMOSFET 40 from damage when P-well 14 is doped and annealed during subsequent processing steps.

Figure 4:
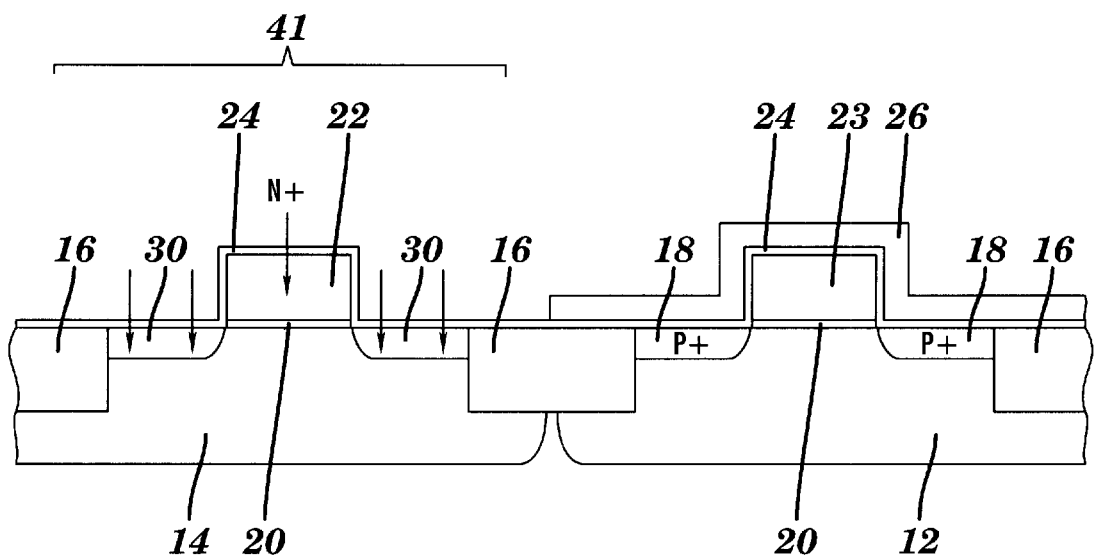
FIG. 4 depicts n+ ion implantation in accordance with the present invention.
Figure 5:
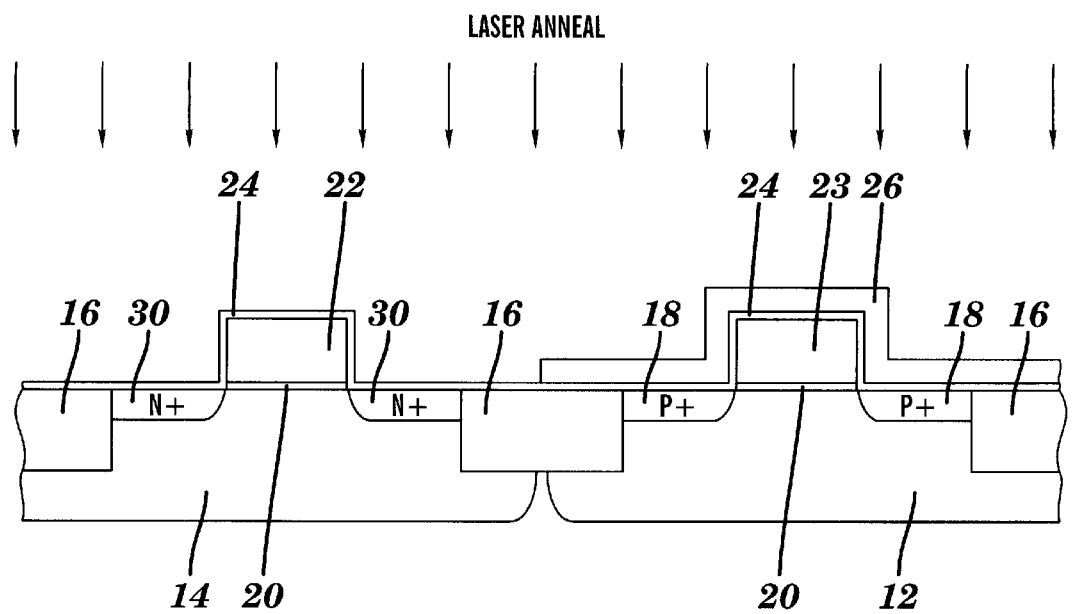
FIG. 5 depicts a laser anneal in accordance with the present invention.
Figure 6:
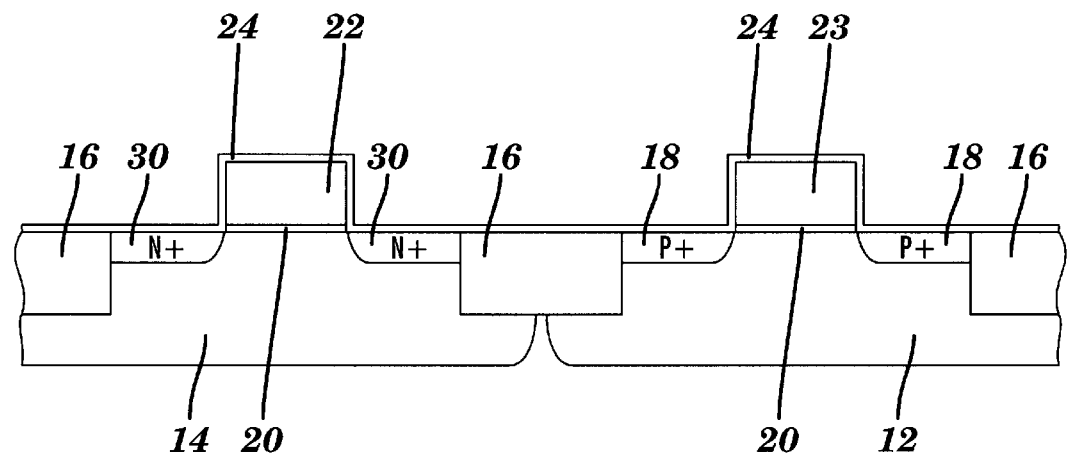
FIG. 6 depicts a semiconductor substrate having doped and activated regions produced in accordance with the present invention.

As depicted in FIG. 4, n+ions, such as singly charged arsenic (As+) or phosphorous (P+), are implanted over P-well 14 and polysilicon gate 22, via ion implantation. Heavily doped N-type source and drain regions 30 and doped polysilicon gate 22 form NMOSFET 41. Substrate 10 is exposed to a pulse laser beam, preferably a zenon chloride excimer laser (having a wavelength of approximately 308 nm), with energy between 50 mJ/cm$^2$ and 5 J/cm$^2$, for a time between 10 milliseconds to 60 seconds to activate the n+ ions implanted in doped source and drain regions 30 and doped polysilicon gate 22, as shown in FIG. 5. Reflective mask 26, located over PMOSFET 40, acts to reflect a portion (approximately 50%) of the incoming laser beam to protect p+ doped source and drain regions 18 and doped polysilicon gate 23 of PMOSFET 40 from damage, while the implanted n+ ions of source and drain regions 30 and doped polysilicon gate 22 of NMOSFET 41 over P-well 14 are being activated. After the activation of the n+ ions of NMOSFET 41, reflective mask 26 is removed using a wet or dry etch or other customary methods, leaving the semiconductor substrate depicted in FIG. 6. This will typically be followed by additional contact and wiring steps to complete the wafer manufacture process.

Figure 7:
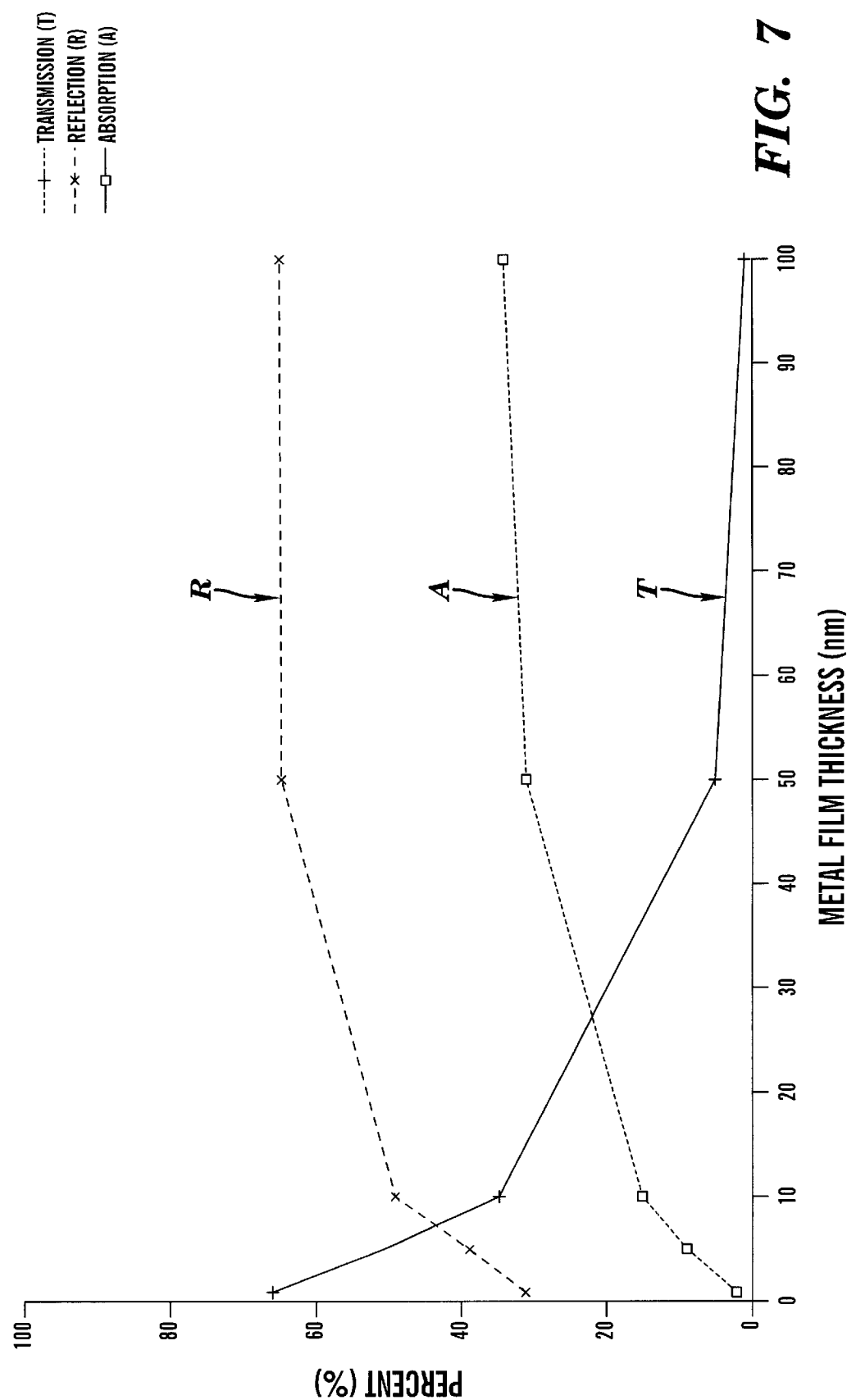
FIG. 7 depicts a plot of the amount of laser transmission, reflection and absorption vs. the thickness of the reflective mask in accordance with the present invention.

FIG. 7 illustrates the percentage of laser light (at 308 nm) that is transmitted, reflected and absorbed, represented by lines T, R and A, respectively, for various thicknesses of reflective mask 26. It is important to note that when the thickness of reflective mask 26 is less than 50 nm, a significant amount of laser light is transmitted, at least 5%, to the underlaying doped layers. However, as the thickness of reflective mask 26 is reduced, for instance to 10 nm, the amount of transmission increases (to approximately 35%). Therefore, since transmitted light is converted to heat energy, and the amount of transmission is dependent upon the thickness of reflective mask 26, local activation may be achieved in varying amounts by adjusting the thickness of reflective mask 26 in select regions. In other words, varying the local topography of reflective mask 26 will allow the amount of dopant activated in the underlying regions to be tailored.

In an alternative embodiment of the present invention, photoresist 28 is not removed prior to exposing the substrate to the laser. This enables the use of a thinner reflective mask 26 since photoresist 28 acts as an implant blocking mask. This may be compared with the process depicted in FIGS. 4 and 5, in which reflective mask 26 acts as both an implant blocking mask and a laser reflective mask.

It should be noted that the above described process is designed to operate using a single ion implantation-laser annealing tool. In other words, the ion implantation and the laser annealing process occur in the same tool, almost simultaneously to save processing time and to improve process control.

The present embodiment is described to optimize both PMOSFET and NMOSFET to manufacture high performance CMOS devices, as an example only. It should also be appreciated that the present invention can be used to improve the manufacture of various other types of semiconductor devices, such as optimizing an array and support device of DRAM (dynamic random access memory), optimizing DRAM and LOGIC devices for merging LOGIC-DRAM products, optimizing bipolar and CMOS devices for BiCMOS products, and so on.

While this invention has been described in conjunction with the specific embodiments outlined above, it is evident that many alternatives, modifications, and variations will be apparent to those skilled in the art. Accordingly, the preferred embodiments of the invention set forth above are intended to be illustrative, not limiting. Various changes may be made without departing form the spirit and scope of the invention as defined in the following claims.

We claim:

1. A method for local activation comprising the steps of:
   providing a substrate having a first section and a second section segregated from the first section, wherein the first section contains a first doped region which includes a first dopant species and the second section contains a second doped region which includes a second dopant species;
   depositing a layer of oxide on the substrate;
   forming a reflective mask on the layer of oxide and over the first doped region and over the second doped region of the substrate, wherein the mask comprises a semi-transparent reflective material selected from the group consisting of aluminum, tungsten, copper and gold and has a first thickness over the first doped region and a second thickness different from the first thickness over the second doped region; and
   simultaneously activating the first dopant species in the first doped region by a first amount and the second dopant species in the second doped region by a second amount, wherein the second amount is different from the first amount, and further wherein heat energy is transmitted using a laser through the reflective mask to the first doped region and through the reflective mask to the second doped region.

2. The method of claim 1, wherein the reflective mask is aluminum.

* * * * *